United States Patent [19]
Cannon

[11] Patent Number: 5,257,416
[45] Date of Patent: Oct. 26, 1993

[54] METHOD FOR DYNAMICALLY CHANGING CHANNEL PRIORITY FOR SCAN IN A RECEIVER

[75] Inventor: Gregory L. Cannon, Coconut Creek, Fla.

[73] Assignee: Motorola, Inc., Schaumburg, Ill.

[21] Appl. No.: 650,124

[22] Filed: Feb. 4, 1991

[51] Int. Cl.$^5$ .............................................. H03J 7/18
[52] U.S. Cl. ................................ 455/166.2; 455/186.1
[58] Field of Search ................ 455/32.1, 38.1, 54.1, 455/58.1, 77, 88, 161.1, 166.1, 166.2, 185.1, 186.1; 340/825.5, 825.51, 825.44; 379/58, 63; 370/85.6

[56] References Cited

U.S. PATENT DOCUMENTS

| | | | |
|---|---|---|---|
| 4,608,712 | 8/1986 | Fedde | 455/166 |
| 4,716,407 | 12/1987 | Borras et al. | 455/166.2 X |
| 4,988,991 | 1/1991 | Motegi | 340/825.5 |

Primary Examiner—Reinhard J. Eisenzopf
Assistant Examiner—Chi Pham
Attorney, Agent, or Firm—M. Mansour Ghomeshi

[57] ABSTRACT

Briefly, according to the invention, a method (100) for updating the channel priority table in a receiver (300) having a signal condition table is disclosed. The receiver (300) is adapted to receive a carrier signal modulated with an information signal having a pre-determined format. The format of the information signal determines the priority of the channel the carrier signal is received on. The steps of the disclosed method include monitoring the carrier signal of the highest priority channel with activity, and periodically scanning (126 and 128) other channels including decoding of their information signals. The decoded information signal is compared to the condition table of the receiver in order to detect a higher priority carrier signal. The higher carrier signal is then monitored and the channel priority table is updated accordingly (120 or 112).

15 Claims, 4 Drawing Sheets

METHOD FOR DYNAMICALLY CHANGING CHANNEL PRIORITY FOR SCAN IN A RECEIVER

TECHNICAL FIELD

This invention relates generally to radio receivers and more particularly relates to receivers having channel scanning capabilities.

BACKGROUND

Multi-channel communication systems generally have a system of priority hierarchy that allows messages with various priority levels to be properly transmitted in order to minimize the perils of missing important messages. This is particularly true in private systems used by police, fire, ambulance services, etc. In these systems, a priority table is created assigning priority status to the channels. A high priority message must be transmitted on one of the high priority channels depending on the nature of the message and the system structure. Receiving units are programmed to interrupt their ongoing communication and monitor the active high priority channel. Purchasers of these communication systems define their desired priority hierarchy at the time of purchase. Any changes that they may wish to implement on their priority table require the purchase of additional equipments. Furthermore, all subscriber units must partake in any such changes. It is obvious that such an operation involving all of the subscribers is a major undertaking. In many situations, despite a highly desirable change in the priority hierarchy, system managers opt against a change due to the involved process. It is therefore clear that a need exists for dynamically changing the priority hierarchy of the channels of a communication system without interrupting its everyday operation.

SUMMARY OF THE INVENTION

Briefly, according to the invention, a method for updating the channel priority table in a receiver having a signal condition table is disclosed. The receiver is adapted to receive a carrier signal modulated with an information signal having a pre-determined format. The format of the information signal determines the priority of the channel the carrier signal is received on. The steps of the disclosed method include monitoring the carrier signal of the highest priority channel with activity and periodically scanning other channels including decoding of their information signal. The steps continue with comparing the decoded information signal to the condition table of the receiver in order to detect a higher priority carrier signal. The higher carrier signal is then monitored and the channel priority table is updated accordingly.

In other aspects of the invention the method for updating the channel priority table determines when activity is present on the highest priority channel. This determination is followed by monitoring of the highest priority channel with no interruptions.

DETAILED DESCRIPTION OF THE PREFERRED EMBODIMENT

Figure 1A:
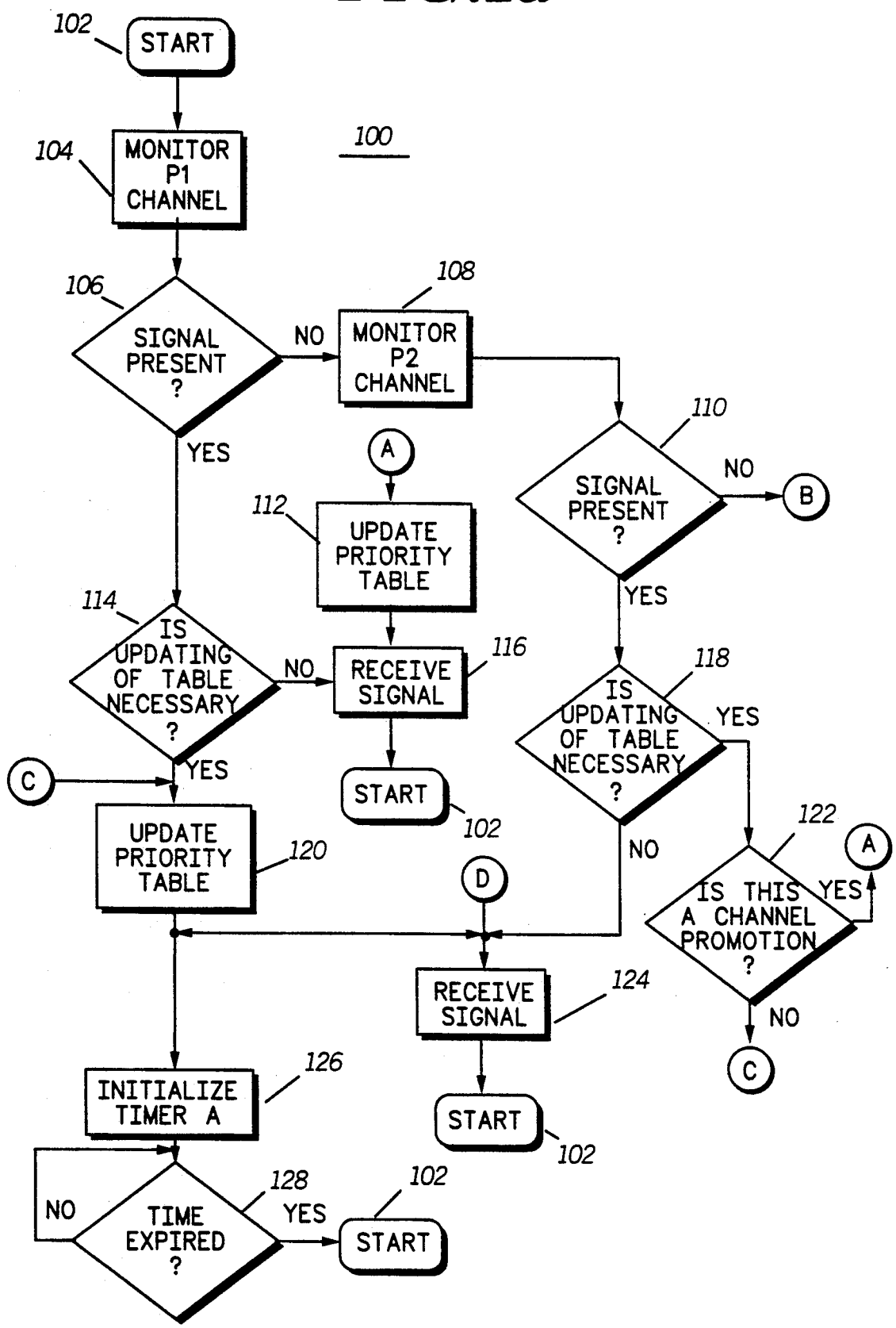
FIGS. 1a and 1b are flow charts of the operation of the dynamic channel priority scan in accordance with the present invention.
Figure 1B:
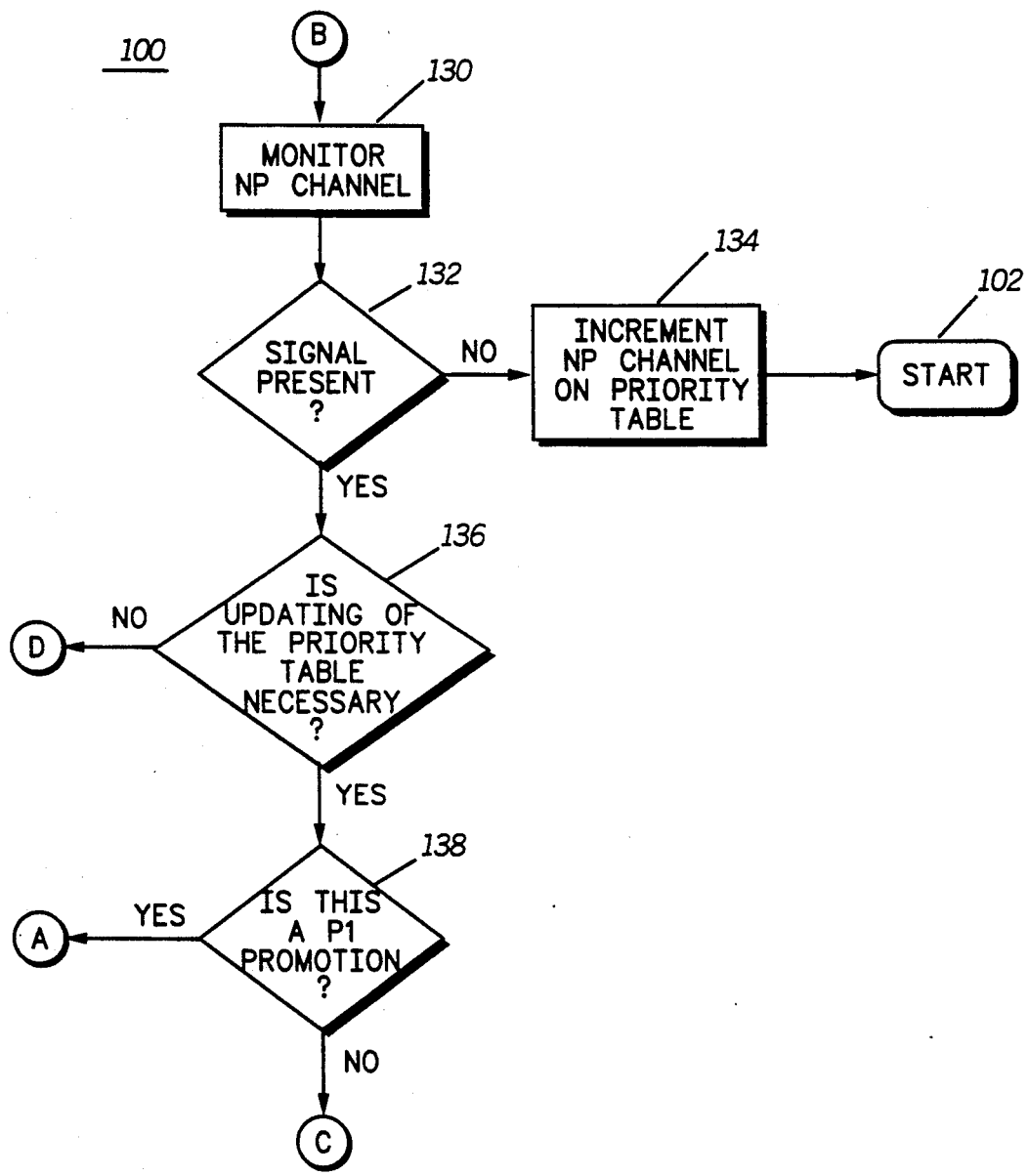

Referring to FIGS. 1a and 1b, a flow chart 100 of the operation of the dynamic channel priority scan is shown in accordance with the present invention. This flow chart 100 shows a method for determining the priority hierarchy of a receiver with a plurality of channels. From a start block 102, the highest priority channel (P1) is monitored by a monitor P1 channel block 104. Block 104 is followed by a condition block 106 where the presence of a signal is questioned. The YES output of the condition block 106 is coupled to a second condition block 114. At the condition block 114 a decision is made as to whether an updating of the channel priority table is necessary. The priority of the channel being monitored is determined by contents of the information signal modulating the carrier signal of the channel. The information signal has a pre-determined format which follows a set of criteria establishing the priority level of the channel. This set of criteria is contained in a condition table, part of the hardware implementing this flow chart. In this embodiment, the pre-determined format of the information signal for a P1 channel is MDC data which is a signalling scheme used in data communications. The pre-determined format of the information signal may include a series of sub-audible tones, low speed digital codes, or other signaling schemes. As part of the operation of block 114 the information signal is decoded and evaluated against the condition table to determine any changes that may have occurred in the priority of the channel being monitored. The NO output of the condition block 114 indicates that the channel of the present signal is still the P1 channel and therefore no updating of the priority table is necessary. This NO decision is followed by a receive signal block 116 where the receiver is directed to monitor or otherwise receive the signal. Upon completing the signal reception the operation is returned to the start block 102. Note that no interruptions are introduced while a P1 signal is being received. This is due to the possible emergency nature of the P1 channel. In many applications the P1 channel is reserved primarily for emergency use, therefore interruptions must be prevented. One such system is a public safety system where an emergency in progress is highly expected to continue with no interruptions.

The YES output of the condition block 114 indicates that the channel indicated by the priority table as being P1 is no longer so, and that it has been demoted to a lower priority. This change of priority must be introduced to the channel priority table for future reference, and that is accomplished by an update priority table block 120 connected to the YES output of block 114. The updating of the channel priority table includes demoting the present P1 channel to appropriate levels. The output of the update priority table block 120 is branched to a receive signal block 124 and an initialize timer A block 126. The receive signal block 124 proceeds to receive the detected signal. While the reception is in progress, a timer A is initialized as indicated by block 126. The output of block 126 is connected to a condition block 128 where a decision is made as to whether the time A has expired. The NO output of block 128 is routed back to the condition block 128 (therefore creating a timer). The YES output of block 128 which indicates that the time A has elapsed returns the operation to the start block 102. The loop created by this return to the start block 102 constitutes the step of periodically scanning channels for activity. It is significant that means be provided for periodically interrupting the reception of signals and monitoring channel activities for higher priority signals. This is accomplished by the loop comprising blocks 126, 128, and 102. Note that as the operation is returned to the start block 102 a scanning of channels becomes necessary to detect the new P1 channel. It is during this monitoring that the reception of the present P1 activity is interrupted.

In summary the highest priority channel, according to the channel priority table, is monitored. In the event that a carrier signal is present the algorithm decodes the information signal of the carrier signal to determine any changes in the priority level of the channel. If the information signal meets the conditions of a P1 channel, the receiver proceeds to receive the signal via block 116 with no interruptions. If, however, a change in the priority of the channel has been detected in the information signal, the receiver proceeds to update the priority table and then receive the lower than P1 signal. Since the signal being received is not a P1 signal, a timer is utilized to periodically interrupt the signal reception and scan channels for activities.

The NO output of the condition block 106 is connected to a monitor P2 channel. P2 refers to the second highest priority channel. In this embodiment, the predetermined format of the information signal for a P2 channel is the specific sub-audible tones used. As mentioned with P1 priority channels, various signalling schemes or digital codes may be used in defining a P2 channel. The output of block 108 is connected to a condition block 110 where the presence of a signal is questioned. The YES output of block 110 is connected to yet another condition block 118 to determine whether an updating of the priority table is necessary. The NO output of the decision block 118 indicates that the channel monitored is indeed a P2 channel and should remain the same. This output is connected to the receive signal block 124 where the loop of receiving the signal and periodically interrupting the reception to scan channels for activity is repeated. The YES output of the decision block 118 indicates that the channel on which signal is being received is no longer a P2 channel. Since this was a P2 channel, there are two possibilities for the new priority classification of the channel. The new classification will either promote the channel to P1 or demote it to a non priority (NP) channel. These possibilities are explored at the condition block 122 where a decision is made as to whether the channel should be promoted to a P1 status. The NO output of the decision block 122, indicating that a demotion is necessary, is connected to the update priority table 120 followed by the receive signal block 124. The operation of these blocks was presented earlier. The YES output of the condition block 122 is connected to an update priority table 112. At this block 112 the P2 channel becomes the new P1 channel. The old P1 becomes the new P2, otherwise the two top priority channels are swapped. The output of block 112 is connected to the receive signal block 116 and subsequently returned to start block 102. Once again note that no interruptions in the reception of the P1 signal are introduced.

In summary, when a carrier signal is present on a P2 channel, the receiver proceeds to examine its modulating information signal to determine whether the priority classification of the channel is appropriate. If so the signal is received along with periodical scans of the channels for higher priority (P1) activity. In the event that a change in the priority classification of the channel has occurred, a decision is made as to whether the change is downward (to NP) or upward (to P1). An upward change or otherwise a promotional change places the present channel as P1 on the priority table. This action is followed by receiving the signal without any further interruptions. A downward or otherwise demotional change takes the path that includes receiving the signal with periodical scans for detection of any higher priority activities.

The NO output of block 110 which indicates the absence of signals on P1 or P2 channels is connected to a monitor NP channel block 130 shown in FIG. 1b. The function of this block is to first check an NP channel pointer in the channel priority table to determine the correct NP channel that must be monitored. This is because there are generally more than one NP channel in a particular receiver. After determining the correct NP channel to be monitored block 130 proceeds to monitor that channel for activity. This monitor block 130 is connected to a decision block 132 where the presence of signal on the recently determined NP channel is detected. The NO output of block 132 is connected to block 134 where the NP channel pointer on the priority table is increased by one. The output of block 134 returns the operation to the start block 102. The increasing of the channel pointer is required so that the monitor channel block 130 doesn't monitor the same NP channel as the loop is repeated.

The YES output of block 132 is connected to a second decision block 136 where the necessity for updating the priority table is questioned. Once again since channel priority can be dynamically changed via the information signal, the priority classification of every incoming signal is monitored and followed by appropriate updating of the channel priority table. The NO output of this block 136 which indicates that the channel classified as NP is indeed so, is connected to the receive signal block 124 on FIG. 1a where the signal is received with periodic interruptions for scan. The YES output of the condition block 136 indicates that the channel priority of the channel being monitored has changed. This output is connected to a third decision block 138 where a decision is made as to whether the monitored channel meets the requirements of a P1 channel. The YES output of the decision block 138 is connected back to block 112 on FIG. 1a. At this block the channel priority table is once again updated making the NP channel the new P1 channel. The old P1 channel is demoted by one and made the new P2 channel. The P2 channel is demoted to a NP channel. The NO output of the decision block 138 indicates that the channel being monitored is a P2 channel and is therefore connected to block 120 of FIG. 1a where the priority table is updated accordingly. At this update the NP channel being monitored becomes the new P2 channel, demoting the old P2 channel to a NP channel. The operation of the system after the completion of block 120 will not be repeated here as it is explained above.

To summarize, the signal on an NP channel is monitored and evaluated for any changes to the priority table it may carry. In the event of no changes in the priority hierarchy, the monitoring of the NP channel continues with periodic scanning interruptions. A change in the priority hierarchy, as indicated by the pre-determined format of the information signal, is first treated to determine the level of change to P1 or P2. When a change to P1 is encountered the channel priority table is updated and the reception of the signal continues without any further interruptions. A channel change to P2 is updated on the channel priority table and signal monitored with periodic interruptions for scanning of the P1 channel.

Figure 2A:
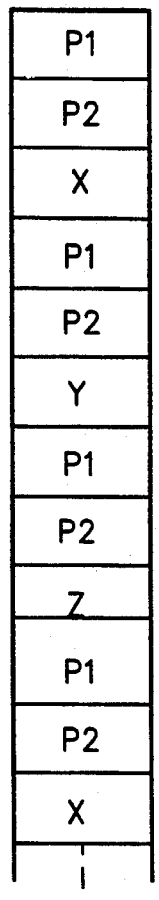
FIGS. 2a through 2d are scan sequences for various states.

FIG. 2a through 2d show a series of possible sequences of scanning channels in a receiver. FIG. 2a shows the scan sequence when no high priority channels (P1 and P2) are present. This figure shows the scanning sequence by first monitoring the P1 and then the P2 channels before attempting to monitor channel X, a NP channel. In the event of no activity on any of the three channels the receiver returns to scanning P1 and P2 channels. The NP channel monitored at this time depends on the number of NP channels available in a particular receiver. In here more than one, indeed three NP channels are assumed X, Y, and Z. The scanning of the channels continues with monitoring Y followed by P1, P2, Z, and so forth. The pointer mentioned in association with block 134 is incremented to point at X, Y, and Z as it goes through its cycles.

Figure 2C:
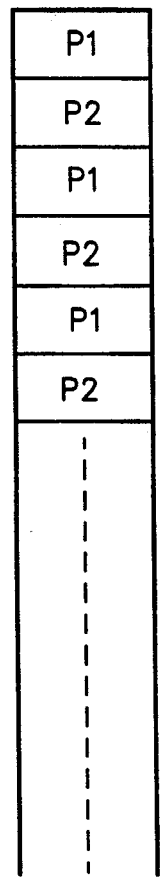
Figure 2D:
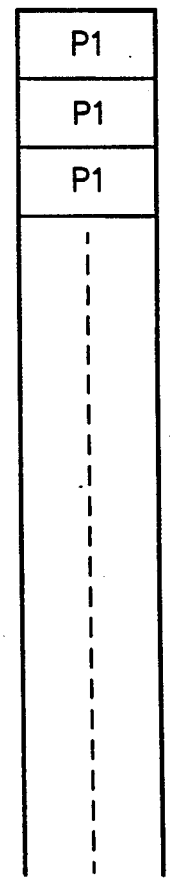
Figure 2B:
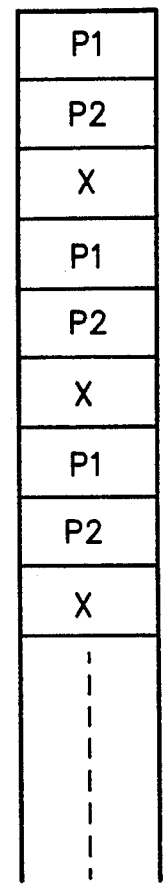

FIG. 2b shows the sequence of channels scanned when a NP channel X is being monitored. It is shown that the reception of the NP channel X is periodically interrupted to monitor P1 and P2. FIG. 2c shows the sequence of channels scanned when a P2 channel is being monitored. As can be seen the sequence never leaves the P2 to monitor a lower priority channel. FIG. 2d shows the sequence of channels monitored when the receiver is monitoring a P1 channel. Notice that no interruption of the monitoring of the P1 channel takes place.

Those skilled in the art will recognize that various modifications and changes could be made with respect to the above described invention, without departing from the spirit and scope of the invention as set forth. Therefore, it should be understood that the claims are not to be considered as limited to the particular embodiments set forth in the absence of specific limitations expressly incorporating such embodiments.

Figure 3:
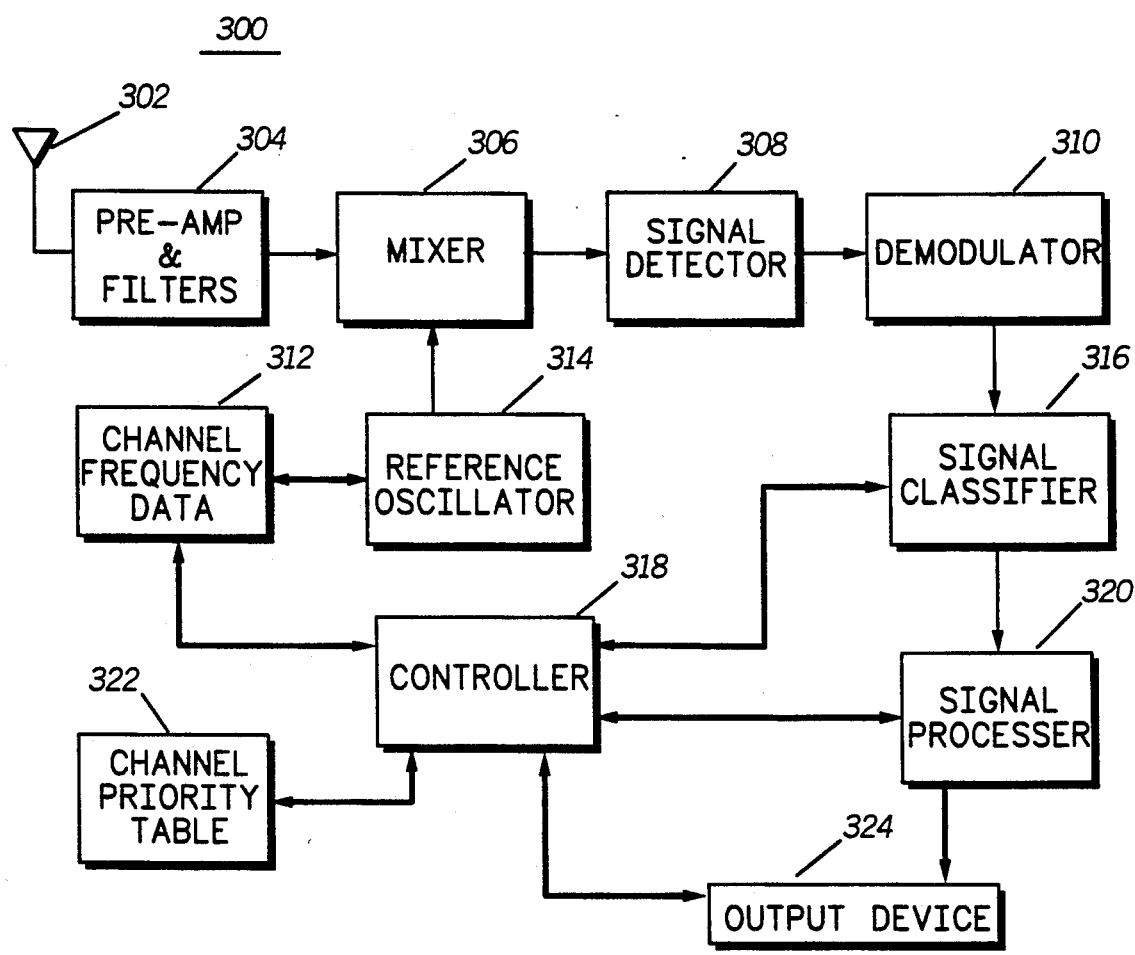
FIG. 3 is a block diagram of the essential elements of a receiver in accordance with the present invention.

Referring now to FIG. 3 a block diagram of a receiver 300 is shown in accordance with the present invention. A signal received by an antenna 302 is coupled to a pre-amplifier and filters block 304. The received radio frequency signal at the input of the block 304 is amplified and filtered before being applied to the first input of a mixer block 306. The second input of the mixer 306 is connected to a reference oscillator 314. The output of the mixer 306 which is at IF frequency is connected to a signal detector 308 where the channel activity is monitored. The signal detector 308 performs the operation of block 106 in the flow chart 100. The output of the signal detector 308 is connected to a demodulator 310. This block 310 demodulates the IF signal to produce the information signal which is applied to a signal classifier 316. The signal classifier 316 classifies the received information signal to determine the priority of the channel that the carrier arrived on. A controller 318 is at the center of the operation of the receiver 300. The condition table may be included as part of the controller 318. A channel priority table 322 is connected to the controller 318 providing the controller 318 with vital channel priority information. The bidirectional bold lines arriving and leaving the controller 318 are control lines intended for communicating with various blocks of the receiver 300. The input of a channel frequency data block 312 is also connected to the controller 318. The output of the channel frequency data 312 is connected to the reference oscillator 314 and directs it to change its operating frequency. This connection between the controller 318 and the reference oscillator 314 permits the scanning of the channels as deemed appropriate by the controller 318 which performs the essentials of the flow chart 100.

The bold line between the signal classifier 316 and the controller 318 allows the classifier 316 to compare the decoded information signal with the contents of the condition table in the controller 318. This action provides for the signal classifier 316 to classify the incoming signal in order to determine the priority level of the channel. The intelligence in the information signal, whether voice or data is submitted to a signal processor 320. The operation of the signal processor 320 is also controlled by the controller 318. The signal processor 320 processes the information signal and presents it to an output device 324 which may be a speaker or a display screen.

Those skilled in the art appreciate the availability of other receiver circuits to achieve similar results. The presentation of this receiver should be construed only as an example (and not as a limitation) to further clarify the preferred embodiment of the present invention.

What is claimed is:

1. In a receiver having a channel priority table and a signal condition table, the receiver adapted for receiving carrier signals modulated with information signals having a pre-determined format indicating the priority level of the channel of the carrier signal, a method for updating the channel priority table, comprising the steps of:
    monitoring the carrier signal of the highest priority channel with activity;
    periodically interrupting the monitoring of the highest priority channel to scan and decode the information signals of other channels;
    comparing the pre-determined format of the decoded information signal of the other channels to the condition table to detect a higher priority carrier signal; and
    monitoring the higher priority carrier signal and updating the channel priority table accordingly.

2. The method of claim 1, further including the steps of:
    determining when activity is present on the highest priority channel of the priority table; and
    monitoring the highest priority channel without interruptions.

3. The method of claim 1, wherein the step of updating the channel priority table includes swapping the priorities of the channel being monitored with the detected higher priority channel.

4. The method of claim 1, wherein the step of updating the channel priority table includes demoting the lower priority channels.

5. The method of claim 1, wherein the step of updating the channel priority table includes promoting the higher priority channels.

6. In a receiver for receiving carrier signals available on a plurality of channels, the carrier signals being modulated with information signals having pre-determined formats, a method for determining the priority hierarchy of the plurality of channels comprising the steps of:
    receiving and demodulating a first carrier signal;

periodically interrupting the receiving and demodulating of the first carrier signal and scanning other channels for carrier signals with higher priority;

decoding the information signal of the carrier signals with higher priority to determine their priority level; and monitoring the second carrier signal with higher priority and updating the priority hierarchy.

7. The method of claim 6, wherein the step of updating the priority hierarchy includes swapping the priority level of two channels of the first carrier signal and the carrier signal with higher priority.

8. A method for dynamically updating a priority table in a receiver that receives a carrier signal modulated with an information signal containing priority information of the channel, comprising the steps of:

detecting the presence of a carrier signal in a channel to produce a detected channel;

decoding the information signal of the carrier signal;

determining whether the detected channel, in response to the decoding of the information signal, has the classifications of the highest priority channel;

updating the priority table accordingly; and monitoring the channel which has the classifications of the highest priority channel.

9. The method of claim 8, further including the steps of:

determining when the detected channel does not have the classifications of the highest priority channel;

updating the priority table accordingly;

demodulating the carrier signal of the detected channel;

periodically scanning airwaves for a higher priority signal; and demodulating the higher priority signal and updating the priority table accordingly.

10. The method of claim 8, wherein the step of monitoring includes the uninterrupted monitoring of the highest priority channel.

11. A method for determining the order of monitoring channels in a multi-channel receiver having a channel priority table, comprising the steps of:

scanning channels for activity;

demodulating a signal on a channel with activity to produce an information signal;

decoding the information signal to determine the priority level of the channel; and updating the priority table.

12. The method of claim 11, wherein the step of scanning channels for activity includes the step of interrupting the operation of the receiver.

13. The method of claim 12, wherein the step of interrupting the operation of the receiver is bypassed when the highest priority channel is being monitored.

14. The method of claim 11, wherein the step of scanning channels for activity includes scanning channels with highest priority first.

15. The method of claim 14, wherein the step of scanning channels for activity includes scanning those channels having a higher priority than the presently monitored channel.

* * * * *